United States Patent
Hsu et al.

(10) Patent No.: US 6,411,157 B1
(45) Date of Patent: Jun. 25, 2002

(54) SELF-REFRESH ON-CHIP VOLTAGE GENERATOR

(75) Inventors: Louis L. Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,650

(22) Filed: Jun. 29, 2000

(51) Int. Cl.[7] .................................................. G05F 3/02
(52) U.S. Cl. ...................................... 327/536; 327/534
(58) Field of Search ................................ 327/534, 535, 327/536; 365/226, 229

(56) References Cited

U.S. PATENT DOCUMENTS

| | | | | |
|---|---|---|---|---|
| 4,961,167 A | * | 10/1990 | Kumanoya et al. | 365/189.09 |
| 5,189,316 A | * | 2/1993 | Murakami et al. | 327/541 |
| 5,315,557 A | | 5/1994 | Kim | 327/536 |
| 5,337,284 A | * | 8/1994 | Cordoba et al. | 365/227 |
| 5,557,231 A | | 9/1996 | Yamaguchi | 327/534 |
| 5,602,704 A | * | 2/1997 | Javanifard et al. | 365/226 |
| 5,633,825 A | * | 5/1997 | Sakuta | 327/534 |
| 5,673,232 A | * | 9/1997 | Furutani | 365/226 |
| 5,856,951 A | | 1/1999 | Arimoto et al. | 365/226 |
| 6,031,411 A | * | 2/2000 | Tsay et al. | 327/536 |

OTHER PUBLICATIONS

"A Self–Off–Time Detector for Reducing Standby Current of DRAM", by Ho–Jun Song, IEEE Journal of Solid–State Circuits, vol. 32, No. 10, )ctober 1997, pp. 1535–1542.

* cited by examiner

Primary Examiner—Terry D. Cunningham
(74) Attorney, Agent, or Firm—Scully, Scott, Murphy & Presser; Daryl K. Neff

(57) ABSTRACT

A voltage control system and methodology for maintaining internally generated voltage levels in a semiconductor chip. The method comprises the steps of intermittently sampling an internal voltage supply level during a low power or "sleep" mode of operation; comparing the internal voltage supply level against a predetermined voltage reference level; and, activating a voltage supply generator for increasing the internal voltage supply level when the internal voltage supply level falls below the predetermined voltage reference level. The voltage supply generator is subsequently deactivated when the voltage supply level is restored to the predetermined voltage reference level. The sampling cycle may be appropriately tailored according to chip condition, chip temperature, and chip size. In one embodiment, the voltage control system and methodology is implemented in DRAM circuits during a refresh operation. The voltage levels that are suitable for sampling including DRAM bandgap reference voltage, boost wordline line voltage, wordline low voltage, bitline high voltage and bitline equalization voltages.

29 Claims, 7 Drawing Sheets

Block Diagram for Generator Sampling Scheme

Block Diagram of DC Generator

SELF-REFRESH ON-CHIP VOLTAGE GENERATOR

BACKGROUND OF THE INVENTION

1. Field of the Invention

The present invention relates generally to standby power systems for semiconductor chips such as dynamic random access memory (DRAM), and, particularly, to an on-chip, self-refresh voltage generator system and method for reducing the power of on-chip voltage generators during non-active mode periods.

2. Discussion of the Prior Art

Normally, all the on-chip voltage generators must be maintained active even during the standby, or sleep mode in order to keep voltage levels for certain operations during these modes. Additionally, when the chip resumes normal operation, all the voltage levels must be ready immediately for normal operations. For these reasons, the on-chip voltage generators are designed to have both active generators and standby generators with the active generators being used during the active mode, and the standby generators being kept on constantly after power-on to guard the voltage drop due to charge leakage due to any mechanism. In semiconductor chips, there are many disadvantages of implementing a standby generator. For example: 1) the standby generators require extra chip areas; 2) the standby generator consumes DC power, e.g., a body back bias voltage (Vbb) standby pump consumes 15 uA; and 3) during the active mode, the standby generator is weaker and slower, and consequently, is not very useful or effective.

An exemplary system used for reducing power consumption is described in U.S. Pat. No. 5,337,284 which is directed to a system implemented in an integrated circuit for generating high voltages for use in low-power applications. Particularly, U.S. Pat. No. 5,337,284 is directed to implementation of a voltage pump (charge pumps), comprising a standby pump and several active pumps. During a standby mode of operation, only a standby pump is left on in order to save power. A notable feature of U.S. Pat. No. 5,337,284 is the implementation of a self-timed clock circuit which obviates the requirement for a free-running oscillator.

Other state of the art on-chip power reduction systems includes U.S. Pat. Nos. 5,189,316, 5,856,951, and 5,315,557.

U.S. Pat. No. 5,189,316 is directed to a step-down voltage generator system comprising means for stepping-down an external supply voltage level (e.g., Vext) to an internal level (e.g., Vint) which is lower than the supply voltage level. In U.S. Pat. No. 5,189,316, during standby, the Vint generator is shut off and the Vint power buss is connected to the Vext to save power. A significant disadvantage of this approach is that the gate oxide at standby will be stressed more, possibly resulting in the need for thick-oxide devices for the circuits which will degrade the circuit performance. Another disadvantage is that, during standby, there will be also higher threshold and junction leakage due to the usage of the higher voltage supply.

U.S. Pat. No. 5,856,951 is directed to a system for generating a reduced Vint and elevated power source voltage Vss (typically at ground potential) to be used during a standby mode to cut down the standby power and leakage. This design requires extra hardware in order to create such extra supply levels. However, the extra area increase may not warrant the gain in the power saving. U.S. Pat. No. 5,315,557 describes a system for generating a refresh clock pulse in conjunction with a mechanism for disabling only a substrate bias generator, Vbb, during refresh operation to save power. The Vbb power generation circuit only consumes current in the microamp range which is not considered a significant power saving.

A reference authored by Ho-Jun Song entitled "A Self-Off-Time Detector for Reducing Standby Current of DRAM", IEEE Journal of Solid-State Circuits, Vol. 32, No. Oct. 10, 1997, pp 1535–1542, describes a timer circuit implemented for reducing standby current due to various voltage generators in DRAM circuits. In this reference, a built-in time detector circuit is provisioned for evaluating an "off-time" interval, i.e., the time elapsed for the monitored supply voltage at a first level to reach a predetermined second level in a first cycle of operation.

built in time detector then initiates sampling and re-pumping of the monitored supply voltage to the original first level at the end of the off-time interval and at each successive off-time interval for the duration of the standby period. This built-in time detector however, is a complex circuit and costly in terms of real estate, i.e., it takes up more chip area, and power consumption, as power itself is consumed during the first cycle time detection operation.

It would thus be highly desirable to provide an on-chip, self-refresh voltage generator system and method for reducing the power of all on-chip voltage generators during non-active mode periods while maintaining stable voltage levels on the semiconductor chip with minimum power consumption. As DRAM memory device designs have an ever increasing requirement to operate at reduced power levels, it would additionally be highly desirable to provide an on-chip, self-refresh voltage generator system operable for refreshing DRAM memory storage cells at reduced power consumption levels.

SUMMARY OF THE INVENTION

It is an object of the present invention to provide a system for controlling an internally supplied voltage level generated within an integrated circuit, and, for reducing the power of on-chip voltage generators during non-active mode periods while maintaining stable voltage levels on the semiconductor chip with minimum power consumption.

It is a further object of the present invention to provide an on-chip, self-refresh voltage generator system operable for refreshing DRAM memory storage cells at reduced power consumption levels.

It is another object of the present invention to provide an on-chip, self-refresh voltage generator system that leverages use of an existing on-chip self-refresh clock generator to perform a periodic wake-up task.

According to a first aspect of the invention, there is provided a system and method for controlling an internally supplied voltage level generated within an integrated circuit, the system comprising: a voltage supply generator providing a voltage source for internal, on-chip use and responsive to a low power enable signal for placing the system in a low power mode; and, a limiter device for intermittently sampling the internal voltage supply level during the low power mode, and for determining whether the internal voltage supply level falls below a predetermined voltage reference level, and, when the internal voltage supply level falls below the predetermined voltage reference level, the limiter device activating the voltage supply generator for increasing the internal voltage supply level, and deactivating the voltage supply generator when the voltage supply level is restored to said predetermined voltage reference level, whereby internally generated voltage levels are maintained throughout system low power operation.

Preferably the intermittent sampling cycle may be tailored according to internal chip condition, chip temperature, and chip size.

Advantageously, the on-chip, self-refresh voltage generator system of the invention may be implemented in any semiconductor chip, e.g., DRAM memory circuits, and obviates the need for a standby generator and related standby circuitry thus, reducing power consumption and chip real estate. Furthermore, the voltage control system may be implemented for every active voltage generator used for refresh operations and that is capable of being placed in a low power or "sleep" mode for power conservation.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT OF THE INVENTION

The invention is a circuit architecture and methodology for periodically waking up an active generator to check on the voltage supply level during a sleep mode of operation. If the supply level is lower than a predetermined target level, the generator components such as charge pump and voltage regulator (limiter) will be activated to restore the level and go back to sleep. The advantage of this approach is to eliminate the need of standby generator, and cut down the power that is consumed by the standby hardware and also reduce the circuit area. It is understood that the existing on-chip self-refresh clock generator may be used to generate the signals used to perform the wake-up task.

Figure 1:
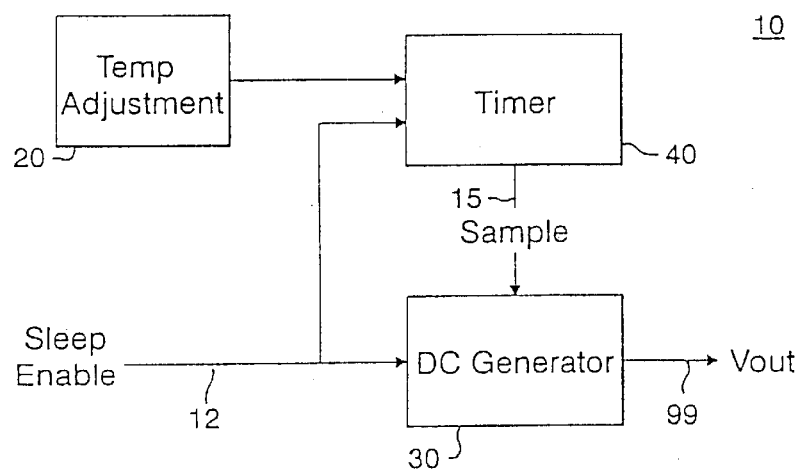
FIG. 1 is a block diagram illustrating the on-chip, self-refresh voltage generator system 10 according to the principles of the invention.

FIG. 1 is a block diagram illustrating the on-chip, self-refresh voltage generator system 10 according to the principles of the invention. As shown in FIG. 1, the self-refresh voltage generator system 10 comprises three major components: 1) a temperature adjust circuit 20; 2) a DC voltage generator 30; and, 3) a sample generator (timer circuit) 40 for generating a sample_clock (SAMPLE) signal 15 which determines the refresh sample rate and duration. This SAMPLE signal 15 is input to the DC DC voltage generator 30 for controlling the sampling the supply voltage of the active DC voltage generator when in the sleep mode as will be described. The output (Vout) of the DC voltage generator is a voltage signal 99.

Figure 3:
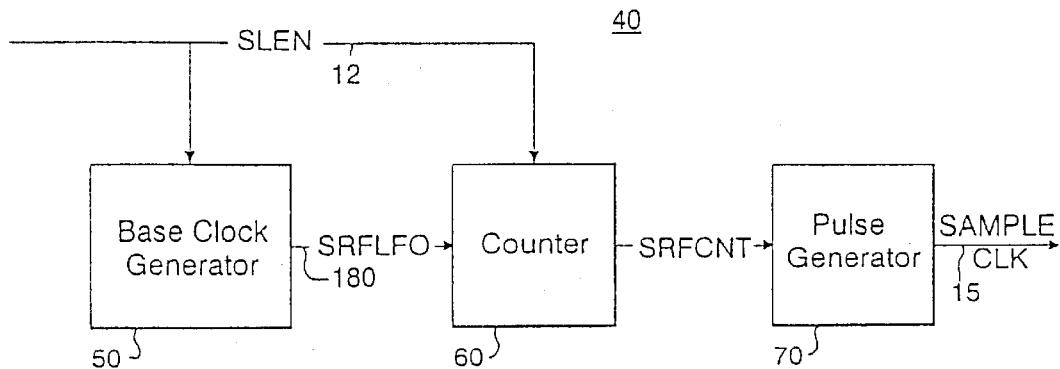
FIG. 3 illustrates the timing relationship of sleep_enable (SLEN) and sample_clock (SAMPLE) signals generated in accordance with the invention.

FIG. 3 is a detailed schematic diagram of an example sample clock generator circuit 40 according to the principles of invention. In the example embodiment shown in FIG. 5, the example sample clock generator circuit 40 comprises a low-frequency oscillator (Base clock generator) circuit 50 for generating a low frequency pulse output signal 180, a counter circuit 60 and a pulse generator 70 which cooperatively produce the sample clock signal 15.

Figure 5:
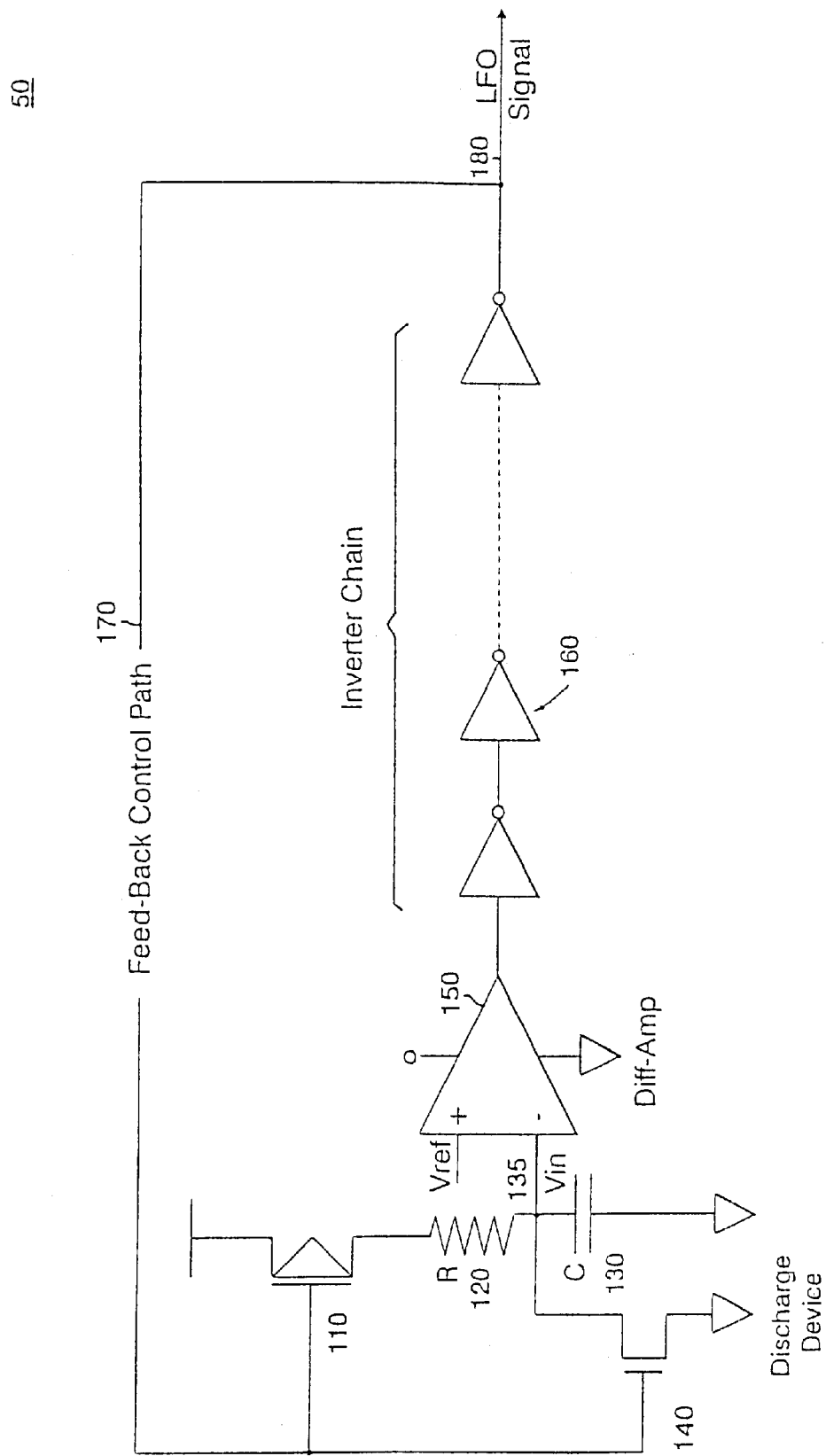
FIG. 5 is a detailed schematic diagram illustrating an example sample clock generator circuit according to the principles of invention.

FIG. 5 is a detailed schematic diagram of an example Base clock generator circuit 50 including a resistor R 120 and a capacitor C 130 to form RC timer and, a differential amplifier, i.e., comparator 150. In operation, the capacitor node voltage Vin at node 135 is charged up to a certain voltage level, Vref, via the resistor 120 through a switch, which is depicted as a pMOS transistor device 110. The Vref voltage level is a design choice and for purposes of explanation may be 1.0 volts. Initially, the output of the comparator 150 is low. However, as the Vref charge level at the capacitor is reached, the comparator 150 output swings high, and through a delay chain 160 and feedback path 170 functions to completely discharge the capacitor voltage Vin through a switch device depicted as nMOS device 140. Then, a new cycle begins with the capacitor output building up charge again. Normally a certain sample output pulse width is required which is controlled by a delay inverter chain 160, preferably of an odd number of inverters. In the example embodiment depicted, the output of the base clock generator is a low frequency output signal 180 having a pulse width of about 12 ns, and pulse period of 980 ns, for example.

Figure 7:
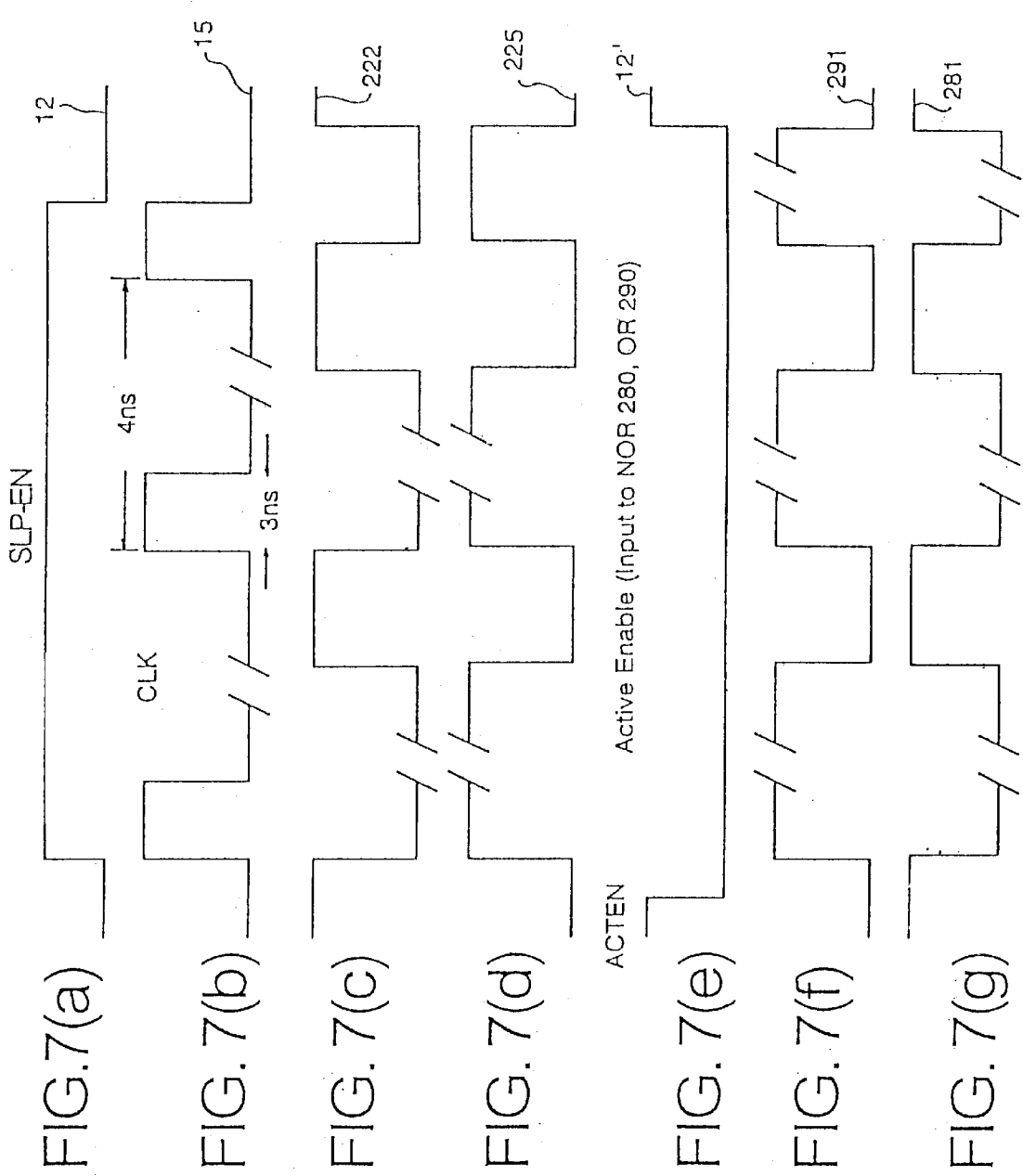
FIGS. 7(a)–7(g) depicts the timing relation between various signals involved in the limiter control circuit provided in a DC generator circuit.

Referring back to FIG. 2, the counter circuit 60 is a well known circuit in the art and may be provided for extending the pulse period by any order of an integer number. For example, the pulse period after the counter may be N*980 ns, where N=4,8 , . . . 128, for an 8-bit counter. Finally, a pulse generator transforms the pulse of the counter output to a width of about 3.0 ns as shown in FIG. 7(b). Skilled artisans may device other ways for generating a sample refresh clock.

That is, as shown in FIG. 7(b), the sample clock generator circuit 40 generates a sample_clock (SAMPLE) signal 15 comprising a narrow pulse of approximately 3.0 ns, at a period of about 4.0 μsec, as an example. It is understood that the period and pulse width may vary due to considerations such as the type of circuit being sampled, e.g., how big the DRAM memory array is, the leakiness of the technology, the temperature, etc. For example, referring back to FIG. 1, the temperature adjust circuit 20 may be implemented for adjusting the sample interval based on the semiconductor chip temperature. FIG. 7(a) further illustrates the timing relationship of the on-chip generated sleep_enable (SLEN) signal 12 and the sample_clock (SAMPLE) signals generated.

Figure 2:
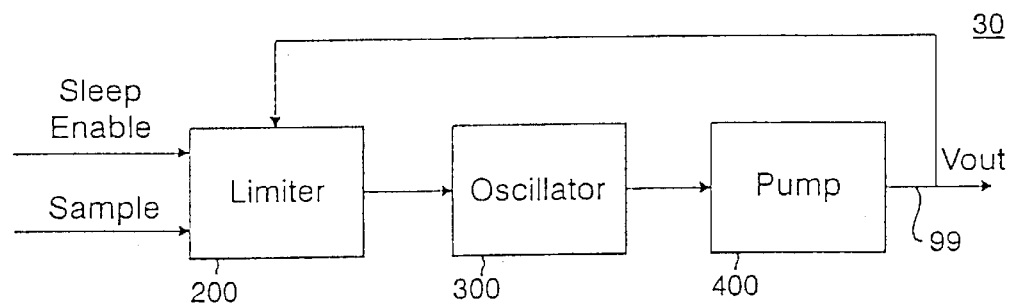
FIG. 2 is a block diagram illustrating the DC voltage generator according to the principles of invention.

Referring now to FIG. 2 there is depicted a detailed block diagram illustrating the DC voltage generator 30 according to the principles of invention. As shown in FIG. 2, the DC generator comprises a limiter circuit 200, an oscillator 300 and a charge pump 400. As known to skilled artisans, the oscillator 300 and charge pump 400 operate in conjunction for boosting a voltage level. In the preferred embodiment of the invention, the limiter 200, voltage oscillator 300 and charge pump 400 operate to monitor the voltage level of each active generator circuit output provided in the semiconductor chip, generally indicated as Vout signal 99 in FIG. 1, during sample_clock pulse periods when operating in the sleep mode.

Figure 4:
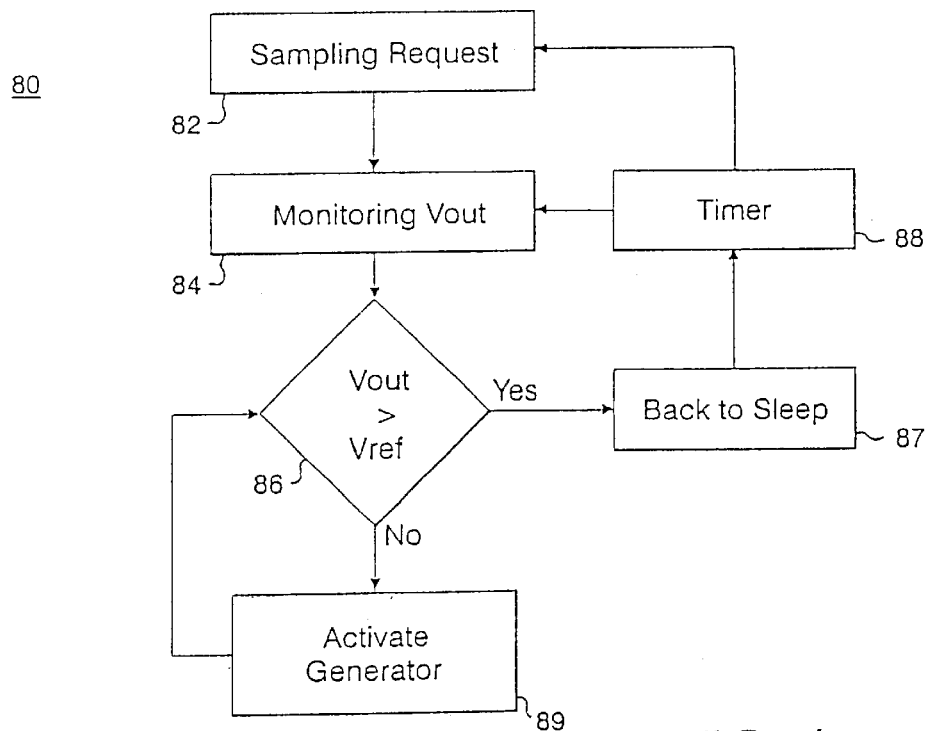
FIG. 4 is a flow chart depicting the operation of the sampling scheme implemented in accordance with the present invention.

FIG. 4 is a flow chart depiction of the sampling scheme operation 80 for on-chip, voltage refresh during sleep mode. At a first step 82, the sampling pulse is generated to initiate a monitoring of the Vout of the DC voltage generator circuit 30 (FIG. 1) during sleep mode which is performed at step 84. At step 86, the monitored voltage Vout is compared against a Vref voltage which is dependent upon the particular DC voltage generator. If the Vout is greater than the Vref voltage, then the DC generator is placed back to the sleep mode at step 87 until the next sample_clock pulse is generated by timer circuit 40 (FIG. 1) as depicted at step 88. If however, at step 86, it is determined that Vout is less than the Vref voltage, then the generator oscillator and charge pump circuits will be activated at step 89 in order to boost the voltage until the Vout is greater than the Vref, at which time the generator is placed back into the sleep mode.

Figure 6:
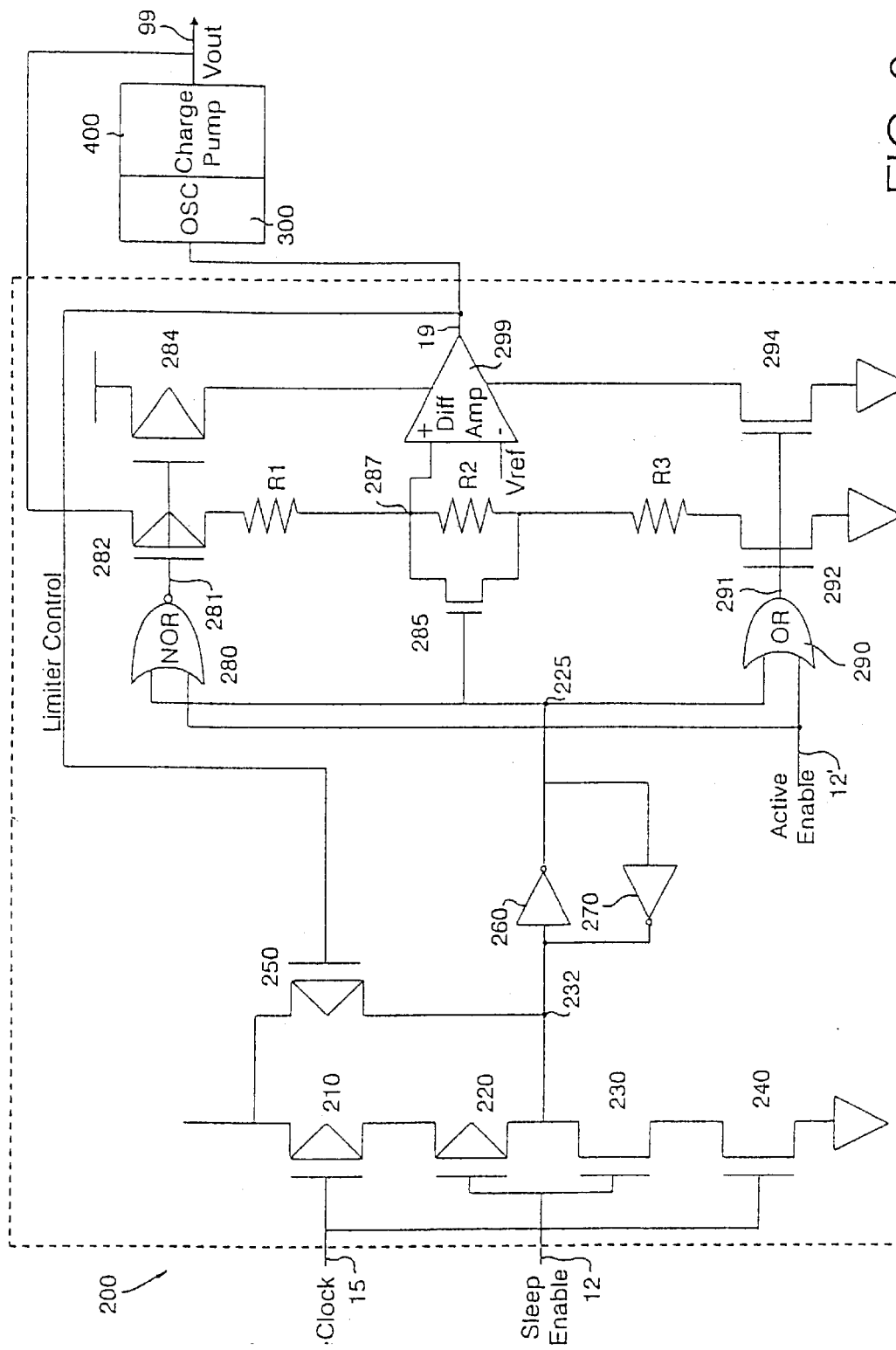
FIG. 6 is a detailed schematic diagram illustrating an example limiter circuit for the DC voltage generator according to the principles of invention.
Figure 8:
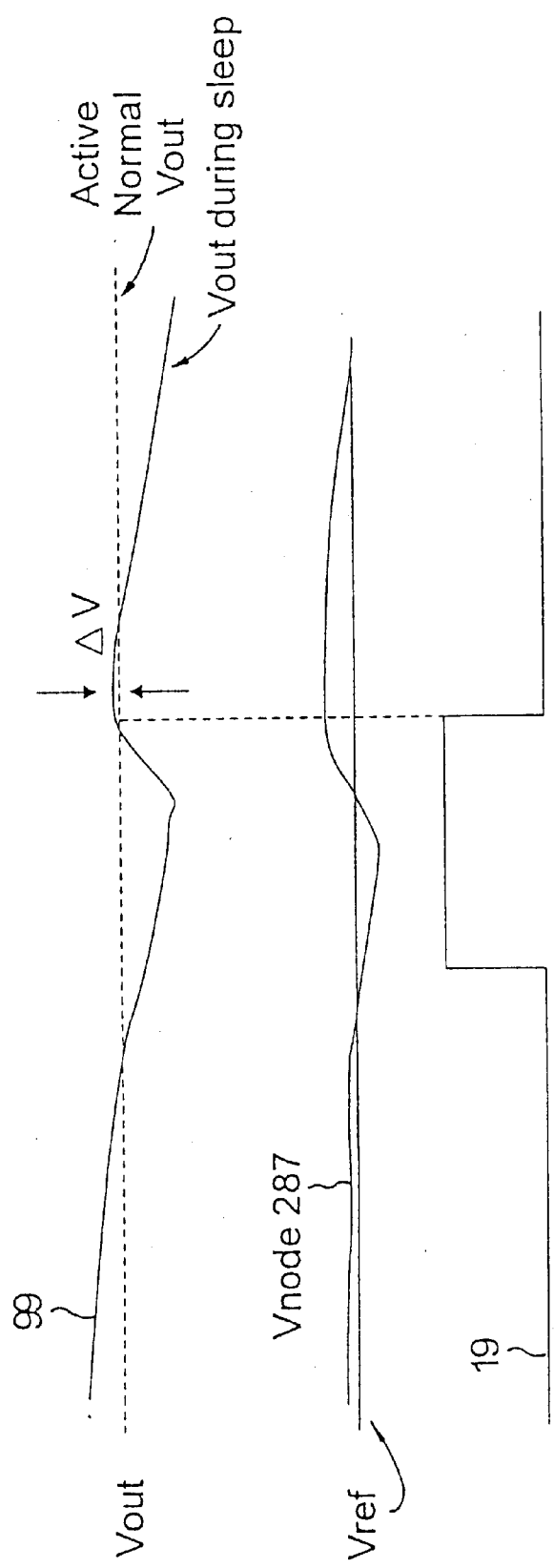
FIG. 8 is an example timing diagram illustrating the relationship between the differential amplifier input signals Vout, Vref and the differential amplifier output voltage signal operable for boosting voltage generator during the chip sleep mode.

FIG. 6 is a detailed schematic diagram of an example sleep mode, self-refresh voltage generator circuit 30 comprising the limiter 200, oscillator 300 and charge pump 400 circuits operating in accordance with the flow chart depicted in FIG. 4. As shown in FIG. 6, initially, during normal operation (active mode), the active_enable signal 12' is high, and the limiter 200 by-passes the refresh control. Thus, the limiter of the generator will be on constantly enabling continuous monitoring of the Vout signal 99 against a voltage reference signal Vref by differential amplifier 299. That is, with active_enable signal 12' high, NOR gate 280 and OR gate 290 are on and, through respective transistors 282, 284 and 292, 294, enables continuous limiter operation including Vout voltage monitoring and voltage charge pumping action. As shown in FIG. 6, through transistor 282, Vout is voltage divided between series resistors R1, R2 and R3 with the Vout voltage at node 287 (between resistors R1 and R2) being fed to one input of a differential amplifier 299. The voltage at node 287 is compared against the predetermined Vref voltage. As further shown in FIG. 6, in the normal operation, the sleep_enable SLEN 12 and sample_clock signals 15 are held low, thus forcing the voltage at node 222 to remain high (e.g., logic 1) via transistors 210 and 220. This voltage is latched by latch circuit comprising inverters 260, 270 which output a low (e.g., logic 0) at node 225. It is readily understood that this logic 0 at node 225 prevents transistor 285 from turning on, thus preventing resistor R2 from being bypassed by drain-source connection of transistor 285. This means that the Vout is kept at a slightly lower voltage level during the active mode (normal operation) than sleep mode by virtue of presence of R2. In other words, Vout is intentionally boosted by ΔV, in the range of 100 mv–200 mv, during the sampling in the sleep mode. After sampling the voltage level has to sustain leakage while it is floating. FIG. 8 visually depicts the relationship between Vout voltage and the divided monitored Vout voltage at node 287 as compared with Vref.

As shown in FIG. 8, when the monitored Vout voltage at node 287 decreases below Vref, the differential amplifier output signal 19 is output to turn on oscillator 300 and enable charge pumping to increase the Vout voltage.

As depicted in FIGS. 7(a), the chip enters the sleep mode by activating the sleep_enable signal SLEN 12 (active high). As the active enable and sleep enable modes are mutually exclusive, the active_enable signal 12' is deactivated (active low), as shown in FIG. 7(e). From FIG. 7(b) and as described with reference to the timer circuit 40, the sample_clock signal 15 is additionally generated and fed into the circuit. During periods when the sample-clock 15 signal is low, the input to internal latches formed by inverters 260 and 270 is floating and thus, a logic "0" is input to the OR 280 gate and NOR 290 gate. Consequently, with active_enable at logic low, the limiter is off, i.e., OR gate 290 and transistors 292, 294 and NOR gate and transistors 282, 284 are turned off, thus, disabling differential amplifier Vout monitoring operation. Whenever the sample_clock pulse arrives (FIG. 7(b)), pFET transistors 210, 220 and nFET transistors 230, 240, change state to generate a logic "0" for latching by the internal latch formed by inverters 260 and 270. FIG. 7(c) illustrates the voltage waveform at node 222 as shown in FIG. 6. The output of the internal latch thus comprises an opposite polarity signal voltage at node 225 such as the voltage waveform depicted in FIG. 7(d). Returning to FIG. 6, during the pulse voltage at node 225, the OR gate 290 and consequently transistors 292, 294 are turned on such as depicted in the voltage waveform at node 291 shown in FIG. 7(f). Additionally, NOR gate and transistors 282, 284 are consequently turned on such as depicted in the voltage waveform at node 281 shown in FIG. 7(g). Responsive to turning on these OR and NOR gate elements, Vout voltage monitoring is enabled by the differential amplifier 299 for the duration of the sample_clock pulse. Thus, it is readily understood that during the sleep mode, the limiter is only activated by the refresh clock pulse. When activated, the Vout voltage at node 287 is checked against the Vref reference voltage. If the Vout voltage at node 287 is still higher than the preset voltage Vref, limiter control signal 19 will be low which prevents the oscillator and charge pump to kick on, while resetting the internal latch to "1" via transistor 250 (which turns on) and, in response, shutting off the limiter itself. However, if the Vout voltage at node 287 is lower than the preset Vref level, then the limiter control will be high and the oscillator/charge pump starts working to bring the voltage level Vout to the higher reference level. An example timing diagram depicting the signals Vout, the voltage at node 287, the Vref and the differential output voltage signal 19 operable for boosting voltage generator during the chip sleep mode, is depicted in FIG. 8. According to a preferred embodiment of the invention, one additional aspect of the limiter circuit operation is that during the sampling period when the logic "0" is latched by the internal latch formed by inverters 260 and 270, the resistor R2 is bypassed, i.e., shorted by now turned on transistor 285. Thus, with R2 bypassed, the Vout monitored voltage is slightly increased, thus intentionally boosting the Vout up by ΔV during sleep mode as shown in FIG. 8.

Figure 9:
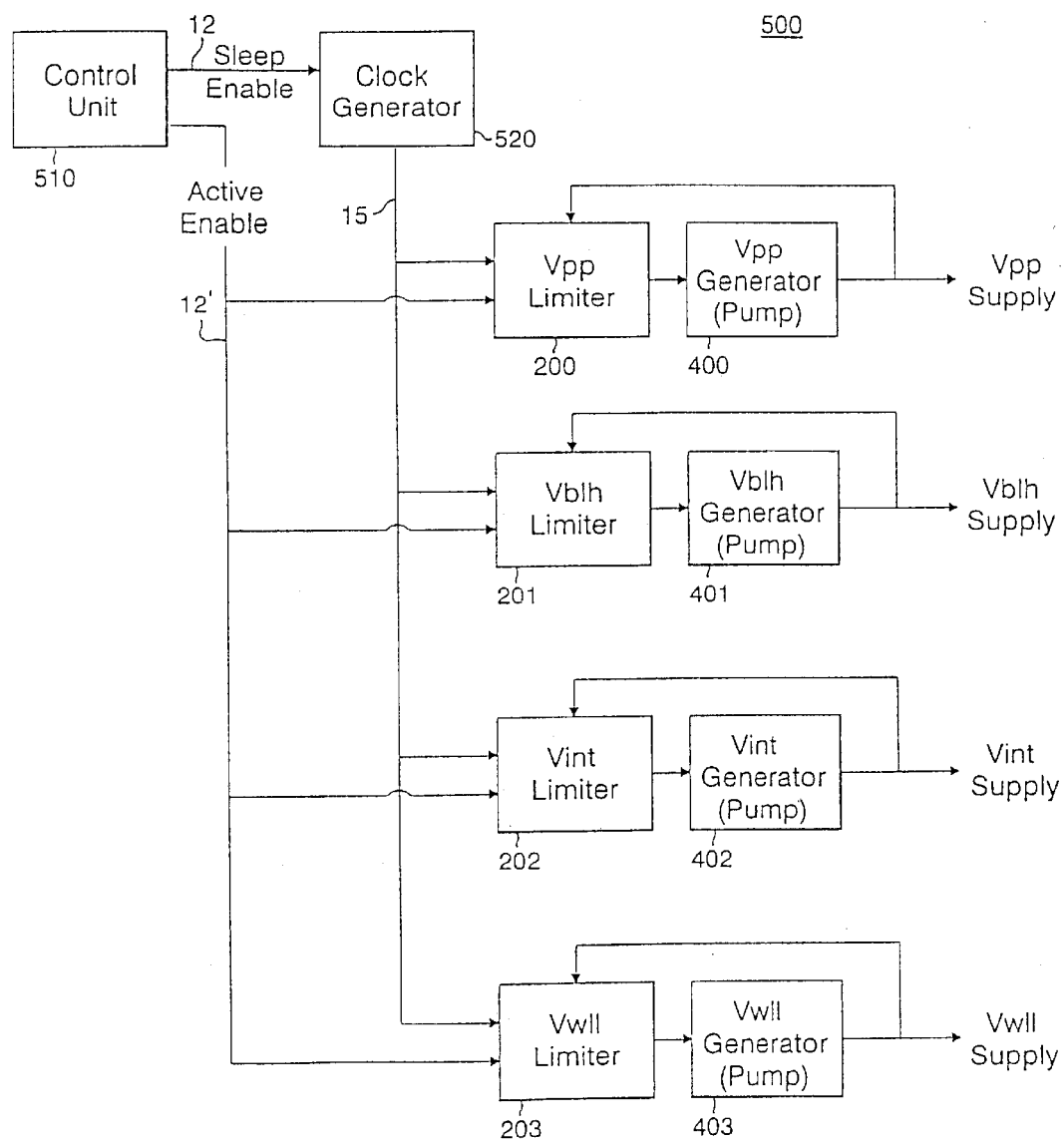
FIG. 9 illustrates the on-chip, self-refresh voltage generator system 500 applied for reducing the power of multiple on-chip voltage generators.

FIG. 9 illustrates the on-chip, self-refresh voltage generator system 500 applied for reducing the standby power of multiple on-chip voltage generators. For example, as shown in FIG. 9 there is a general control unit 510 comprising a CPU or microcontroller or a memory controller for generating the SLEN 12 signal and active enable 12' for input to each of the on-chip voltage generators including: a boost wordline line limiter/pump Vpp 200, 400, a boost voltage bit-line high limiter/pump Vblh 201, 401, an internal voltage limiter/pump Vint 202, 402, and, a wordline low limiter/pump Vwll 203, 403. Additionally provided is a the clock generator circuit 520 corresponding to the timer circuit 40 of FIG. 1 for receiving the SLEN signal 12 and generating respective sample_clock input signals for each of the on-chip voltage wordline line limiter/pump, bit-line high limiter/pump, internal voltage limiter/pump, and, wordline low limiter/pump. It is understood that it is not necessary to sample the body back-bias voltage (Vbb) as no appreciable power savings will result. Other voltages may be sampled including bitline equalization, bandgap reference voltage etc. It is further understood that in the preferred embodiment, a single sampling clock generated by the clock generator is applied to each different active generator's controllers (limiters), so that when they receive the SLEN pulse during the sleep mode, each limiter of the generators may be activated to perform the respective voltage output monitoring in the manner as described herein. The refresh period (sample_clock signal period of FIG. 7(b)) for each generator may additionally be predetermined based on the voltage level retention time. That is, each pump may have its own refresh period.

Although the invention is discussed for DRAM chip design, it is understood that the system and methodology described herein may be used for other voltage regulation systems, or even for software controlled applications. For example, the circuit may be used to provide different standby modes especially aimed at embedded applications. In such an application, for example, a first standby mode may be established for a microprocessor (or CPU) chip during a low-power mode, e.g., nap mode. At this moment, the CPU is partially active. A second standby mode may be established for the CPU chip during a lower-power mode, e.g., sleep mode when the chip is completely inactive. During the first standby mode, the embedded hardware (memory, controller, etc.) will provide voltage levels which have a higher response time and consumes moderate standby power to fulfill nap mode operation. During the second standby mode, the embedded hardware (memory, controller, etc.) will just keep the voltages at their targeted levels which have lower response time and consumes minimum standby power. The first standby mode thus may be sustained by using a set of standby power generators which consume less power than the active generators, but must continuously be active during the nap mode. While in the second standby mode, the voltage levels may be sustained by using the voltage control system and sampling technique described herein with both active and standby generators switched off to save power.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

Having thus described our invention, what we claim as new, and desire to secure the Letters Patent is:

1. A voltage control system for an integrated circuit comprising:
   voltage supply generator providing a voltage source for internal, on-chip use, said voltage supply generator responsive to a low power enable signal for placing said system in a low power mode, and, said voltage supply generator responsive to an active enable signal for placing said system in an active mode; and,
   a limiter device for intermittently sampling an internal voltage supply level of said voltage source during said low power mode, and continuously sampling said internal voltage supply level during said active mode, and for determining whether a voltage result of said sampling falls below a predetermined voltage reference level, and, when said voltage result of said sampling falls below said predetermined voltage reference level, said limiter device activating said voltage supply generator for increasing said internal voltage supply level, and deactivating said voltage supply generator when said voltage result of said sampling is restored to said predetermined voltage reference level, whereby internally generated voltage levels are maintained throughout system low power and active modes of operation.

2. The voltage control system as claimed in claim 1, wherein said limiter device includes comparator means triggered by a sampling input for comparing said internal voltage supply level with said predetermined voltage reference level.

3. The voltage control system as claimed in claim 1, further comprising a timer circuit which is responsive to said low power enable signal, for generating an intermittent timing signal for controlling said limiter device.

4. The voltage control system as claimed in claim 1, wherein said low power mode of operation includes a sleep mode, said low power enable signal comprising a sleep enable signal for placing said system in said sleep mode.

5. The voltage control system as claimed in claim 3, wherein said timer circuit is responsive to said low power enable signal for generating said intermittent timing signal only during said low power mode.

6. The voltage control system as claimed in claim 3, wherein said intermittent timing signal is periodic.

7. The voltage control system as claimed in claim 3, wherein said intermittent timing signal comprises one or more pulses, said timer circuit further comprising means for modifying a pulse width and period of said one or more pulses based on integrated circuit operating conditions.

8. The voltage control system as claimed in claim 2, wherein said voltage supply generator comprises charge pump for boosting said internal voltage supply level, said charge pump responsive to an output of said comparator means.

9. The voltage control system as claimed in claim 2, further comprising a device for intentionally increasing the sampled voltage supply level during a sampling interval.

10. The voltage control system as claimed in claim 9, wherein an output of said voltage supply generator is sampled through a resistor divider circuit, said device for intentionally increasing output voltage including device for decreasing resistance of said resistor divider circuit at said comparator sampling input.

11. The voltage control system as claimed in claim 1, wherein said voltage supply generator remains deactivated until again activated by an intermittent sampling signal.

12. The voltage control system as claimed in claim 1 wherein said voltage supply generator remains deactivated until again activated by receipt of said active enable signal.

13. A method for controlling internally supplied voltage level generated within an integrated circuit, said method comprising:
   a) intermittently sampling said internal voltage supply level during a low-power mode of operation;
   b) continuously sampling said internal voltage supply level during an active mode of operation;
   c) comparing a voltage result of said sampling of said internal voltage supply level against a predetermined voltage reference level; and,
   d) activating a voltage supply generator for increasing said internal voltage supply level when said voltage result of said sampling falls below said predetermined voltage reference level, and, deactivating said voltage supply generator when said voltage result of said sampling is restored to said predetermined voltage reference level, whereby internally generated voltage levels are maintained throughout system low power and active modes of operation.

14. The method as claimed in claim 13, wherein said step of intermittently sampling comprises the step of generating an intermittent timing signal for controlling a sampling device.

15. The method as claimed in claim 14, wherein said intermittent timing signal is periodic.

16. The method as claimed in claim 14, wherein said intermittent timing signal comprises one or more pulses, a pulse width and period of said one or more pulses being modifiable based on integrated circuit operating conditions.

17. The method as claimed in claim 14, wherein said step of intermittently sampling further comprises the step of increasing the sampled voltage supply level during a sampling interval.

18. The method as claimed in claim 17, wherein an output of said voltage supply generator is sampled through a resistor divider circuit, said step of increasing the sampled voltage supply comprising intentionally bypassing a resistor portion in said resistor divider during said sampling interval.

19. The method as claimed in claim 13, further comprising the step of deactivating said voltage supply generator until again activated by an intermittent sampling signal.

20. The method as claimed in claim 13, further comprising the step of deactivating said voltage supply generator until again activated by receipt of an active enable signal.

21. A self-refresh, on-chip voltage generator system for a semiconductor chip and having one or more voltage supply generators each for providing a respective voltage supply for internal semiconductor chip operation, said system comprising:

a limiter device associated with each said voltage generator and responsive to a respective timing signal for intermittently sampling a voltage supply level of the corresponding voltage generator during a low power mode of operation, and responsive to an active enable signal for continuously sampling a respective voltage supply level during an active mode of operation, and for determining whether said sampled voltage supply level falls below an associated predetermined voltage reference level, wherein when any said sampled voltage supply level falls below its associated predetermined voltage reference level, said limiter device activating a respective said voltage supply generator for increasing said respective voltage supply level, and deactivating said respective voltage supply generator when its respective voltage supply level is restored to its associated predetermined voltage reference level, whereby internally generated voltage levels are maintained throughout said system low power operation and active mode operation.

22. The self-refresh, on-chip voltage generator system for a semiconductor chip as claimed in claim 21, wherein said semiconductor chip comprises one of DRAM, flash memory, microprocessor, SRAM and logic circuits.

23. The self-refresh, on-chip voltage generator system for a semiconductor chip as claimed in claim 22, further comprising on-chip clock signal generator for generating an intermittent timing signal for respective limiter sampling.

24. The self-refresh, on-chip voltage generator system for a semiconductor chip as claimed in claim 23, wherein said on-chip clock signal generator generating a periodic refresh signal for controlling internal chip operation.

25. The self-refresh, on-chip voltage generator system for a semiconductor chip as claimed in claim 24, wherein each said intermittent timing signal for respective limiter sampling comprises said periodic refresh signal.

26. The self-refresh, on-chip voltage generator system for a semiconductor chip as claimed in claim 23, wherein said intermittent timing signal is periodic.

27. The self-refresh, on-chip voltage generator system for a semiconductor chip as claimed in claim 24, wherein said on-chip clock signal generator further comprises means for modifying a pulse width and period of said one or more pulses based on semiconductor chip device operating conditions.

28. The self-refresh, on-chip voltage generator system for a semiconductor chip as claimed in claim 23, wherein each said generated intermittent timing signal for a limiter is generated in accordance with the voltage supply generator voltage it is sampling.

29. The self-refresh, on-chip voltage generator system for a semiconductor chip as claimed in claim 28, wherein each said limiter device comprises mechanism for intentionally increasing a respective sampled voltage supply level during a sampling interval in order to sustain leakage current during system low power mode operation.

* * * * *